(12) United States Patent
Takizawa

(10) Patent No.: US 6,344,092 B1
(45) Date of Patent: Feb. 5, 2002

(54) EPITAXIAL SEMICONDUCTOR SUBSTRATE, MANUFACTURING METHOD THEREOF, MANUFACTURING METHOD OF SEMICONDUCTOR DEVICE AND MANUFACTURING METHOD OF SOLID-STATE IMAGING DEVICE

(75) Inventor: Ritsuo Takizawa, Tokyo (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/283,229

(22) Filed: Apr. 1, 1999

(30) Foreign Application Priority Data

Apr. 7, 1998 (JP) ............................. 10-094364

(51) Int. Cl.$^7$ ............................................. H01L 29/00
(52) U.S. Cl. ..................... 148/33; 438/17; 438/143; 438/473; 257/48
(58) Field of Search ................. 148/33, 33.4, 33.5; 438/16, 17, 473, 526, 918, 914, 913, 143, 310

(56) References Cited

U.S. PATENT DOCUMENTS 4,956,693 A * 9/1990 Sawahata et al. ............. 357/64
5,250,445 A   10/1993 Bean et al. ..................... 437/11

FOREIGN PATENT DOCUMENTS

| JP | 03 084931 | 4/1991 |
| JP | 04 010544 A | 1/1992 |
| JP | 6338507 | 12/1994 |
| JP | 09 139408 A | 5/1997 |

OTHER PUBLICATIONS

"The Effect of Heavy Metal Contamination on Defects in CCD Imagers/Contamination Monitoring by Surface Photovoltage" Journal of the Electrochemical Society; vol. 137, No. 1; Jan. 1, 1990; pp. 242–249; Jastrzebski L. et al.
European Search Report dated May 2, 2000.

* cited by examiner

Primary Examiner—Olik Chaudhuri
Assistant Examiner—Ginette Peralta
(74) Attorney, Agent, or Firm—Rader, Fishman & Grauer PLLC; Ronald P. Kananen

(57) ABSTRACT

Quality of epitaxial semiconductor substrates treated by carbon gettering is evaluated precisely and quickly to use only good-quality ones for manufacturing good-property semiconductor devices, such as solid-state imaging devices. After carbon implanted regions and carbon non-implanted regions are made along the surface of a Si substrate by selectively ion-implanting carbon, a Si epitaxial layer is grown on the surface of the Si substrate to obtain a Si epitaxial substrate. Recombination lifetime or surface photo voltage is measured at a portion of the Si epitaxial layer located above the carbon non-implanted region, and the result is used to evaluate acceptability of the Si epitaxial substrate. Thus, strictly selected good-quality Si epitaxial substrates alone are used to manufacture solid-state imaging devices or other semiconductor devices.

15 Claims, 6 Drawing Sheets

EPITAXIAL SEMICONDUCTOR SUBSTRATE, MANUFACTURING METHOD THEREOF, MANUFACTURING METHOD OF SEMICONDUCTOR DEVICE AND MANUFACTURING METHOD OF SOLID-STATE IMAGING DEVICE

BACKGROUND OF THE INVENTION

1. Field of the Invention

This invention relates to an epitaxial semiconductor substrate, manufacturing method thereof, manufacturing method of a semiconductor device and manufacturing method of a solid-state imaging device.

2. Description of the Related Art

As semiconductor substrates for manufacturing semiconductor devices, CZ substrates grown by CZ (Czochralski) method, MCZ substrates grown by MCZ (magnetic field Czochralski) method, and epitaxial substrates having epitaxial layers made on those substrates are often used generally.

As semiconductor substrates for solid-state imaging devices, epitaxial substrates and MCZ substrates are mainly used to reduce uneven image contrast caused by uneven dopant concentration, i.e., striation. Among them, epitaxial substrates can be made to include a low-resistance region (buried region or low-resistance substrate) under epitaxial layers for forming a device, they are effective for progressing low-voltage driving and low power consumption of solid-state imaging devices. Therefore, their wider use is still expected.

For manufacturing silicon (Si) epitaxial substrates, chemical vapor deposition (CVD) is currently used as a practical method, and four kinds of source gases are mainly used therefor. That is, hydrogen reduction process uses $SiCl_4$, or $SiHCl_3$, and reaction occurring there is expressed as follows.

$SiCl_4$ . . . 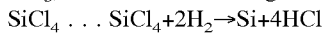

$SiHCl_3$ . . . 

Thermal decomposition method uses $SiH_2Cl_2$ or $SiH_4$, and reaction occurring there is expressed as follows.

$SiH_2cl_2$ . . . 

$SiH_4$ . . . 

Among these four kinds of source gases, $SiHCl_3$ is inexpensive, grows fast, and is suitable for growth of a thick epitaxial layer. And it is most used for manufacturing Si epitaxial substrates for solid-state imaging devices.

However, whichever one of those source gases is used, Si epitaxial substrates have a high impurity concentration, especially metal impurity such as heavy metal impurity, which undesirably mixes in during deposition of the epitaxial layer. Therefore, so-called white defects due to a dark current of a solid-state imaging device cannot be reduced sufficiently, and this makes characteristics and the production yield poor.

Possible sources of metal impurities such as heavy metal impurities are stainless steel (SUS) members in a bell jar of an epitaxial growth apparatus and source material gas pipes, among others. It is assumed that, if a source gas contains a chlorine (Cl) gas, for example, it decomposes and produces HCl during growth, this corrodes stainless steel members to produce a chloride of a metal, the metal chloride is captured into the source gas, and the metal impurity is caught into the epitaxial layer. In some cases, HCl gas is intentionally introduced into a bell jar to lightly etch off the surface of a Si substrate prior to epitaxial growth of layers, and this is also a cause of corrosion of stainless steel members.

Therefore, when a Si epitaxial substrate is used to fabricate a solid-state imaging device, some gettering technique is necessary for removing metal impurities. As such gettering technique, there are, for example, intrinsic gettering for precipitating over-saturated oxygen in the Si substrate exclusively within the substrate and using it as the getter sink, and extrinsic gettering for making a polycrystalline Si film or a region doped with high-concentrated phosphorus (P) on the bottom surface of the Si substrate and utilizing a distortion stress caused thereby to make a getter sink. None of them, however, had sufficient ability to remove metal impurities from a Si epitaxial substrate, and could not sufficiently reduce white defects of solid-state imaging devices.

Taking the above matters into account, the Inventor previously proposed a method for manufacturing a Si epitaxial substrate by implanting carbon into one of the surfaces of an Si substrate by a dose amount of $5 \times 10^{13} cm^{-2}$ or higher and thereafter stacking an Si epitaxial layer thereon (Japanese Patent Laid-Open Publication No. hei 6-338507). According to the method, since a getter sink assumed to be a compound of carbon and oxygen in the substrate can powerfully getter metal impurities, etc. mixed into the epitaxial layer, white defects of solid-state imaging devices could be reduced to ⅕ as compared with Si epitaxial substrates made by using conventional gettering method.

To control impurities (especially metal impurities) mixing into epitaxial layers under growth, conventionally used were (1) a method for observing pits or crystal defects in epitaxial layers after growth, (2) a method for quantitatively measuring heavy metal impurities on the surface of an epitaxial layer or in a substrate bulk by atomic absorption spectrometry, inductively coupled plasma mass spectrometry (ICP-MS), or neutron activation analysis, (3) a method for conducting electric measurement such as lifetime measurement on the entirety of an epitaxial substrate by microwaves, and so on.

Among these methods, control of impurities by microwave lifetime measurement needs no pre-treatment, and gets a result quickly and easily. Therefore, microwave lifetime measurement is used widely. With regard to such, the Applicant also proposed a method for reducing white defects of solid-state imaging devices by using a Si epitaxial substrate having a lifetime whose ratio relative to the lifetime of the Si substrate before deposition of the epitaxial layer is larger than a predetermined value (Japanese Patent Laid-Open Publication No. hei 9-139408).

However, in the Si epitaxial substrate treated by carbon gettering, since the getter sink behaves as a center of electron-hole recombination, there is the problem that the measured lifetime does not reflect the amount of impurities mixing into the epitaxial layer under growth. To date, therefore, instead of measuring the life time of a Si epitaxial substrate treated by carbon gettering, the lifetime was measured from a monitor substrate prepared by forming the epitaxial layer on a Si substrate of the same batch but not treated by carbon gettering, and the result was used to evaluate the quality of the Si epitaxial substrate.

However, even among Si epitaxial substrate made in the same batch, a difference among the substrates is inevitable. Therefore, although there is a correlation to an extent between the lifetime measured from the monitor substrate and white defects of solid-state imaging devices manufactured by using Si epitaxial substrates treated by carbon gettering, the correlation is not satisfactory. It is therefore actually difficult to evaluate white defects of solid-state imaging devices, i.e., degree of impurity contamination of Si epitaxial substrates by heavy metal impurities, for example, and accurately know their acceptabiity from the result of measurement of lifetime using a monitor substrate. Furthermore, a wafer-by-wafer type has become the main current of epitaxial devices made by processing a semiconductor substrate as large as 8 inches or more in diameter, and the degree of impurity contamination varies from one sheet of the semiconductor substrate to another. Therefore, measurement of the lifetime using a monitor substrate has become almost meaningless.

In light of the above there is a strong demand for a technique which enables direct measurement of lifetime of a Si epitaxial substrate itself treated by carbon gettering, and can determine acceptability of the Si epitaxial substrate precisely and quickly.

OBJECTS AND SUMMARY OF THE INVENTION

It is therefore an object of the invention to provide an epitaxial semiconductor substrate and its manufacturing method which enables precise and quick determination of acceptability of the epitaxial semiconductor substrate treated by carbon gettering.

Another object of the invention is to provide a method for manufacturing a semiconductor device capable of precisely and quickly determining acceptability of an epitaxial semiconductor substrate treated by carbon gettering and can manufacture a good semiconductor device with a high yield by using a good epitaxial semiconductor substrate remarkably reduced in impurity contamination by heavy metal impurities, for example.

Another object of the invention is to provide a method for manufacturing a solid-state imaging device capable of precisely and quickly determining acceptability of an epitaxial semiconductor substrate treated by carbon gettering and that can manufacture a good semiconductor device with a high yield by using a good epitaxial semiconductor substrate remarkably reduced in white defects.

According to the first aspect of the invention, there is provided an epitaxial semiconductor substrate having an epitaxial layer in which carbon is ion-implanted along a major surface of a semiconductor substrate, and an epitaxial layer made of a semiconductor is stacked on the major surface of the semiconductor substrate, comprising:

a carbon non-implanted region provided at least in one portion along the major surface of the semiconductor substrate.

According to the second aspect of the invention, there is provided a method for manufacturing an epitaxial semiconductor substrate configured to first ion-implant carbon along a major surface of a semiconductor substrate and thereafter stack an epitaxial layer made of a semiconductor on the major surface of the semiconductor substrate, which includes the step of:

ion implanting carbon along the major surface of the semiconductor substrate while making a carbon non-implanted region at least in one location.

According to the third aspect of the invention, there is provided a method for manufacturing a semiconductor device having an epitaxial semiconductor substrate made by first ion-implanting carbon along a major surface of a semiconductor substrate and thereafter stacking an epitaxial layer made of a semiconductor on the major surface of the semiconductor substrate, which includes the steps of:

ion-implanting carbon along the major surface of the semiconductor substrate while making a carbon non-implanted region at least in one location, then making the epitaxial layer on the major surface of the semiconductor substrate, thereafter measuring recombination lifetime or surface photo voltage of a part of the epitaxial layer located above the carbon non-implanted region, using the result thereof to evaluate acceptability of the epitaxial semiconductor substrate, and manufacturing the semiconductor device by using the epitaxial semiconductor substrate evaluated to be good.

According to the fourth aspect of the invention, there is provided a method for manufacturing a solid-state imaging device having an epitaxial semiconductor substrate made by first ion-implanting carbon along a major surface of a semiconductor substrate and thereafter stacking an epitaxial layer made of a semiconductor on the major surface of the semiconductor substrate, which includes the steps of:

ion-implanting carbon along the major surface of the semiconductor substrate while making a carbon non-implanted region at least in one location, then making the epitaxial layer on the major surface of the semiconductor substrate, thereafter measuring recombination lifetime or surface photo voltage of a part of the epitaxial layer located above the carbon non-implanted region, using the result thereof to evaluate acceptability of the epitaxial semiconductor substrate, and manufacturing the solid-state imaging device by using the epitaxial semiconductor substrate evaluated to be good.

In the present invention, from the viewpoint of obtaining sufficient gettering effect by carbon, the dose amount upon ion implantation of carbon into a major surface of the semiconductor substrate is usually not less than $5\times10^{13}$cm$^{-2}$, and preferably not less than $5\times10^{13}$cm$^{-2}$ and not more than $5\times10^{15}$cm$^{-2}$. Basically, configuration and size of a region of the semiconductor substrate in which carbon is not yet implanted (carbon non-implanted region) can be determined freely as far as it is possible to measure recombination lifetime or surface photo voltage (SPV) in the carbon non-implanted region and the overlying part of the epitaxial layer. However, minimum width of the carbon non-implanted region must be larger at least than the recombination lifetime or mean free path in measurement of the surface photo voltage. Normally, it is not less than the thickness of the semiconductor substrate. The carbon non-implanted region may be as large as one chip for manufacturing a semiconductor device by using the epitaxial semiconductor substrate, for example.

Measurement of the recombination lifetime or the surface photo voltage is most excellent as a method for evaluating heavy metal impurities, for example, mixed in during growth of the epitaxial layer. Measurement of the surface photo voltage is attained by making a charge of the same sign with the majority carrier to adhere onto the surface to be measured, then intermittently irradiating thereon monochromatic light of an energy larger than the band gap energy of the substrate, and measuring changes in barrier height of the surface ($-q\Delta V$) due to the minority carrier generated thereby and moving toward and accumulating on the surface depletion layer. $-q\Delta V$ is the SPV value. As the SPV method, there are a method of adjusting the amount of the irradiated light to make the SPV value constant (constant SPV method) and a method of measuring the SPV value while making the amount of irradiated light constant in the region exhibiting a linear relation between the SPV value and the amount of irradiated light (linear SPV method). The SPV method, in general, uses the diffusion length (L) of the minority carrier as the scale of cleanness of the substrate. The longer the diffusion length, the cleaner the substrate.

In the present invention, determination of acceptability of the epitaxial semiconductor substrate is attained, when using recombination lifetime measurement, typically by measuring recombination lifetime of the semiconductor substrate in the carbon non-implanted region ($T_{sub}$), also measuring the recombination lifetime of the epitaxial layer in the portion above the carbon non-implanted region ($T_{epi}$), and evaluating whether or not the ratio of the measured value of the recombination lifetime of the epitaxial layer above the carbon non-implanted region relative to the measured value of the recombination life time of the semiconductor substrate in the carbon non-implanted region ($T_{epi}/T_{sub}$) is larger than a predetermined value, preferably not smaller than 1/3, and more preferably not smaller than 2/3. For measuring the surface photo voltage, especially using linear SPV method, determination of acceptability of the epitaxial semiconductor substrate is attained by measuring diffusion length of the semiconductor substrate in the carbon non-implanted region ($L_{sub}$), also measuring the diffusion length of the epitaxial layer in the portion above the carbon pre-implanted region ($L_{epi}$), and evaluating whether or not the ratio of the measured value of the diffusion length of the epitaxial layer above the carbon non-implanted region relative to the measured value of the diffusion length of the semiconductor substrate in the carbon non-implanted region ($L_{epi}/L_{sub}$) is larger than a predetermined value, preferably not smaller than 1/3, and more preferably not smaller than 2/3. When using diffusion measurement by SPV method, determination of acceptability need not rely on the ratio of measured values of diffusion length ($L_{epi}/L_{sub}$) but may be based on whether or not $L_{epi}$ is larger than a predetermined value, suitably not less than 200 µm, and more preferably not less than 400 µm.

In the present invention, the solid-state imaging device may be an amplifying type solid-state imaging device or a CMOS solid-state imaging device instead of the CCD solid-state imaging device. The semiconductor device may be any one of various devices such as bipolar LSI, MOSLSI (such as DRAM) or bipolar CMOSLSI instead of those solid-state imaging devices.

In the present invention having the above-summarized construction, by using a location of the epitaxial layer above the carbon non-implanted region of the semiconductor substrate as the measured region, recombination lifetime or surface photo voltage reflecting the true amount of impurities mixed in during growth of the epitaxial layer can be measured directly from the epitaxial semiconductor substrate treated by carbon gettering, and acceptability of the epitaxial semiconductor substrate can be determined precisely and quickly on the basis of the result of the measurement. Then, by using the epitaxial semiconductor substrate evaluated to be good and remarkably reduced in impurity contamination such as heavy metal impurities to manufacture a semiconductor device such as a solid-state imaging device, the invention can ensure high-yield fabrication of a solid-state imaging device or other semiconductor device with remarkably reduced white defects and a good property.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
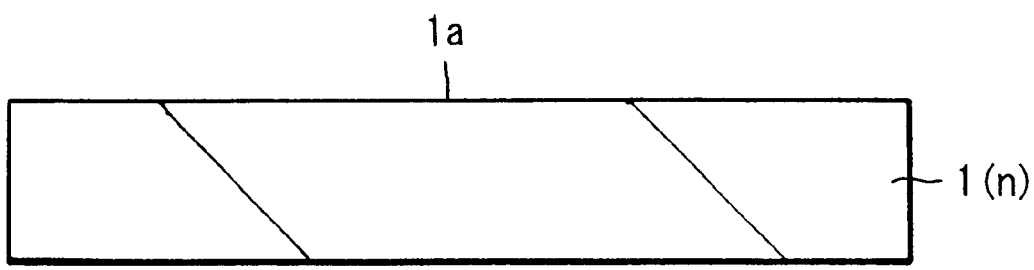
FIG. 1 is a cross-sectional view for explaining a method for manufacturing a Si epitaxial substrate according to the first embodiment of the invention.

Embodiments of the invention are explained below with reference to the drawings. In all of the drawings illustrating the embodiments, the same or equivalent elements or components are denoted by common reference numerals.

FIGS. 1 through 5 show a manufacturing method of a Si epitaxial substrate according to the first embodiment of the invention.

In the first embodiment, first prepared is a (100)-oriented n-type CZ—Si substrate 1, for example, which is cut out from a single-crystalline Si ingot grown by CZ method and fabricated by mirror polishing, as shown in FIG. 1. Reference numeral 1a denotes a mirror surface. The CZ—Si substrate 1 is doped with P as an n-type impurity, and its resistivity is 8 to 12 Ωcm, for example, 10 Ωcm. Diameter of the CZ—Si substrate 1 is for example, 5 inches.

Figure 2:
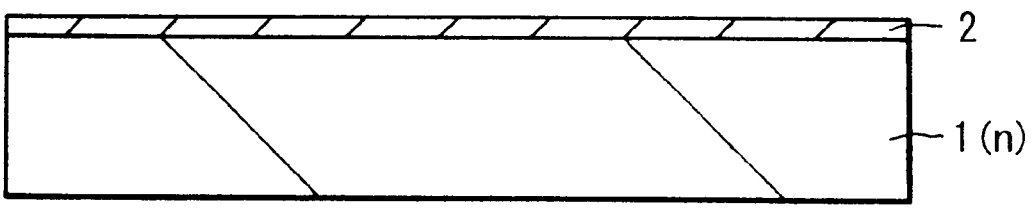
FIG. 2 is a cross-sectional view for explaining the method for manufacturing a Si epitaxial substrate according to the first embodiment of the invention.

After the CZ—Si substrate 1 is cleaned by RCA method, as shown in FIG. 2, it is thermally oxidized at 1000° C., for example, by dry oxidation, for example to form an oxide film 2 made of $SiO_2$ on the mirror surface 1a. Thickness of the oxide film 2 is, for example, 20 nm.

Figure 3:
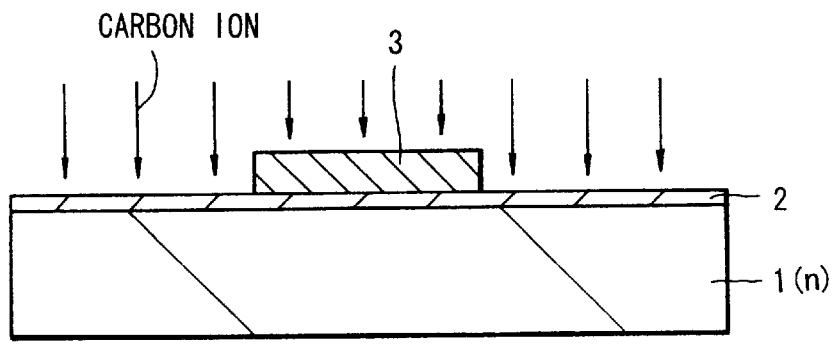
FIG. 3 is a cross-sectional view for explaining the method for manufacturing a Si epitaxial substrate according to the first embodiment of the invention.

Next, as shown in FIG. 3, a resist pattern 3 opening at a portion corresponding to a region for implanting carbon ions is made on the oxide film 2 by lithography. After that, using the resist pattern 3 as a mask, carbon is ion-implanted into the CZ—Si substrate 1. For carbon ion implantation, acceleration energy of 150 keV and dope amount of $1 \times 10^{15} cm^{-2}$ are used, for example. In this case, projected range ($R_p$) of carbon is approximately 0.32 µm, and peak concentration of carbon is approximately $1 \times 10^{19} cm^{-3}$.

Figure 4:
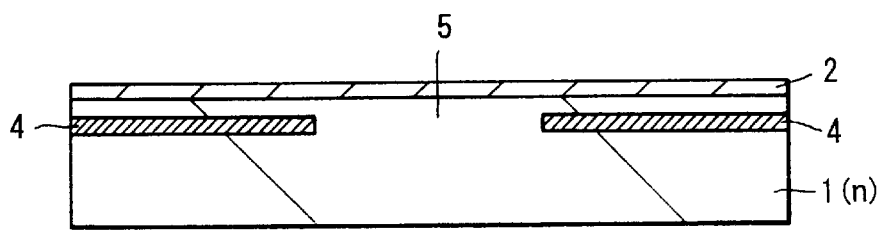
FIG. 4 is a cross-sectional view for explaining the method for manufacturing a Si epitaxial substrate according to the first embodiment of the invention.
Figure 5:
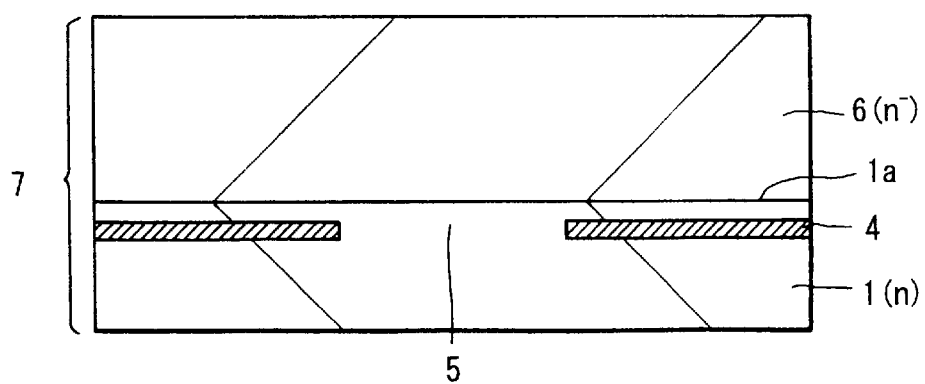
FIG. 5 is a cross-sectional view for explaining the method for manufacturing a Si epitaxial substrate according to the first embodiment of the invention.

Then, the resist pattern 3 is removed, and the CZ—Si substrate 1 is cleaned by RCA method. After that, the CZ—Si substrate 1 is annealed in a nitrogen atmosphere, for example, at 1000° C., for example, for 10 minutes. As a result of annealing, a carbon implanted region 4 having its peak concentration at a position deeper than the mirror surface 1a of the CZ—Si substrate 1 and a carbon non-implanted region 5 are made as shown in FIG. 4. The reason why the carbon peak-concentrated position in the carbon implanted region 4 is deeper than the mirror surface 1a lies in the requirement for preventing deterioration of crystalline quality of an n-type Si epitaxial layer 6 grown in the next step. Although the annealing is conducted in the nitrogen atmosphere after carbon ion implantation for the purpose of recovering the crystalline property of the CZ—Si substrate 1 near the mirror surface 1a, which is once changed to an amorphous phase by ion implantation, it may be omitted under certain implantation conditions.

After that, the oxide film 2 is removed by etching using an etchant which contains HF solution, for example. Thereafter, as shown in FIG. 5C, the n⁻-type Si epitaxial layer 6 is grown at a temperature around 1120° C., for example, by CVD using $SiHCl_3$, for example, as the source gas to complete the Si epitaxial substrate 7. The n⁻-type Si epitaxial layer 6 is doped with P, for example, as its n-type impurity. Its resistivity is 40 to 50 Ωcm, for example, and the thickness is 8 μm, for example.

Figure 6:
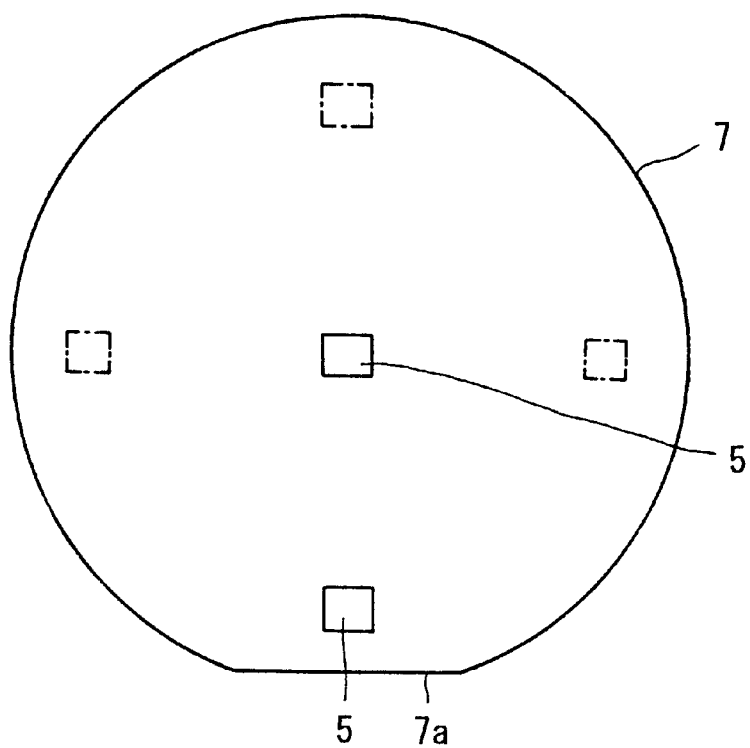
FIG. 6 is a plan view of an example of the Si epitaxial substrate manufactured by the first embodiment.

An example of the Si epitaxial substrate 7 manufactured in this manner is shown in FIG. 6. As shown here, this example has formed square carbon non-implanted regions 5 at two locations of the CZ—Si substrate 1 at the center of the Si epitaxial substrate 7 and near a flatly oriented region 7a, respectively. Sides of these carbon non-implanted regions 5 are parallel to directions parallel and normal to the flatly oriented region 7a, for example. The size of each carbon non-implanted region 5 is, for example, 10 mm×10 mm or 8 mm×8 mm.

To estimate acceptability of the Si epitaxial substrate 7 made in the above-explained process, recombination lifetime is measured by microwaves in the n⁻-type Si epitaxial layer 6 above the carbon non-implanted region 5, and only Si epitaxial substrates 7 demonstrating a good result are selected. A result of measurement on recombination lifetime is evaluated in the following manner. That is, respectively measured are recombination lifetime $\tau_{sub}$ of the carbon non-implanted region 5 of the CZ—Si substrate 1 before growth of the n⁻-type Si epitaxial layer 6 and lifetime $\tau_{epi}$ of a part of the Si epitaxial substrate 7 above the carbon non-implanted region 5. When $\tau_{epi}/\tau_{sub}$ is ⅔ or more, for example, the Si epitaxial substrate 7 is classified to be good.

FIGS. 7 through 11 illustrate a manufacturing method of a CCD solid-state imaging device according to the second embodiment of the invention.

In the second embodiment, first prepared is a good Si epitaxial substrate 7 remarkably reduced in impurity contamination such as heavy metal impurities, which has been selected in the above-explained manner.

Figure 7:
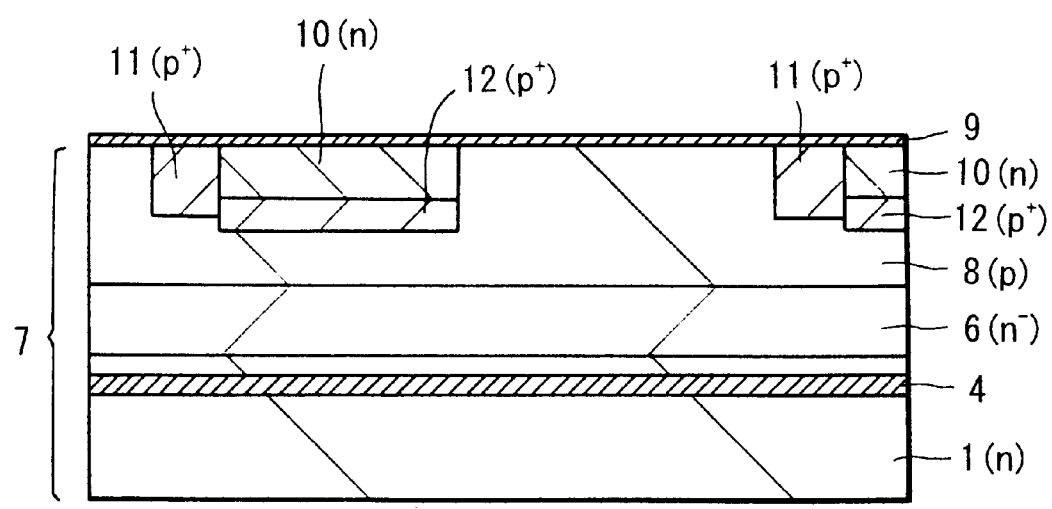
FIG. 7 is a cross-sectional view for explaining a method for manufacturing a CCD solid-state imaging device according to the second embodiment of the invention.

Next, as shown in FIG. 7, a p-type well region 8 is formed in the n⁻-type Si epitaxial layer 6 of the Si epitaxial substrate 7 by ion implantation, for example. After that, an insulating film 9 of $SiO_2$, for example, is made on the surface of the p-type well region 8 by thermal oxidation, for example. Then, by selectively ion-implanting an n-type impurity and a p-type impurity into the p-type well region 8, respectively, an n-type transfer channel region 10 forms a vertical transfer register, with a p⁺-type channel stop region 11 adjacent thereto and a p⁺-type well region 12 under the n-type transfer channel region 10.

Figure 8:
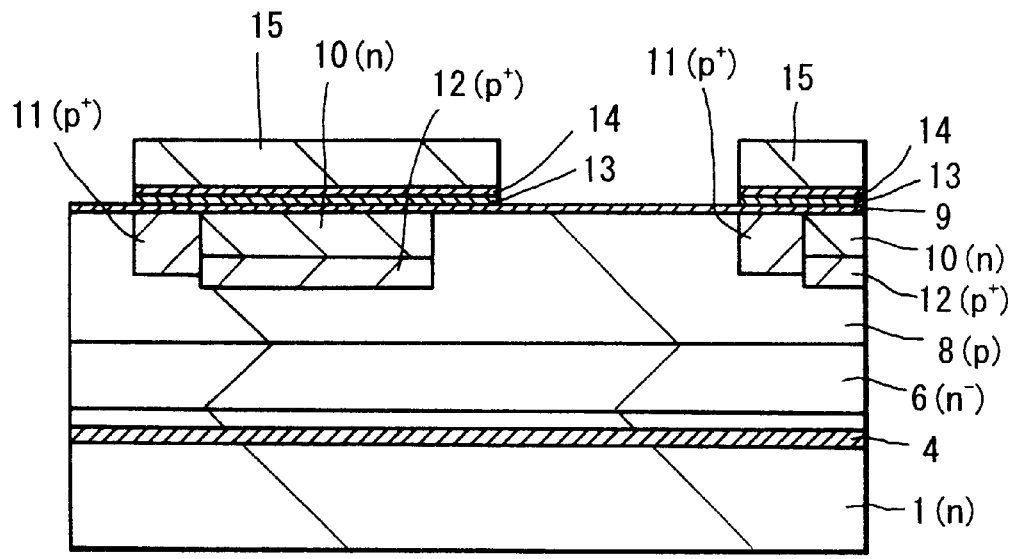
FIG. 8 is a cross-sectional view for explaining the method for manufacturing a CCD solid-state imaging device according to the second embodiment of the invention.

Thereafter, as shown in FIG. 8, formed on the insulating film 9 is a transfer electrode 15 via an insulating film 13 such as $Si_3N_4$ film and an insulating film 14 such as $SiO_2$ film, for example. The insulating films 9, 13 and 14 form a gate insulating film. When the insulating films 9 and 14 are $SiO_2$ films, and the insulating film 13 is a $Si_3N_4$ film, the gate insulating film is a so-called ONO film. The transfer electrode 15 is made of a poly-crystalline Si film doped with an impurity such as P.

Figure 9:
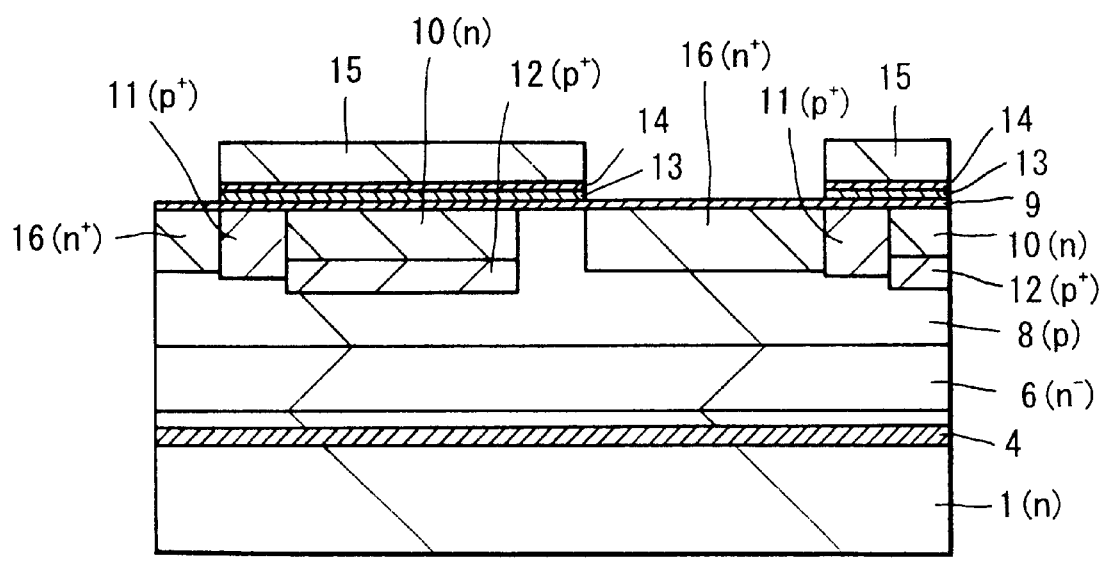
FIG. 9 is a cross-sectional view for explaining the method for manufacturing a CCD solid-state imaging device according to the second embodiment of the invention.

Next as shown in FIG. 9, n⁺-type regions 16 are made by selectively ion-implanting an n-type impurity into locations of the p-type well region 8 to be made as photo sensor portions. The pn junction made of the n⁺-type region 16 and the p-type well region 8 forms a photo diode to serve as a photo sensor (photoelectric converter).

Figure 10:
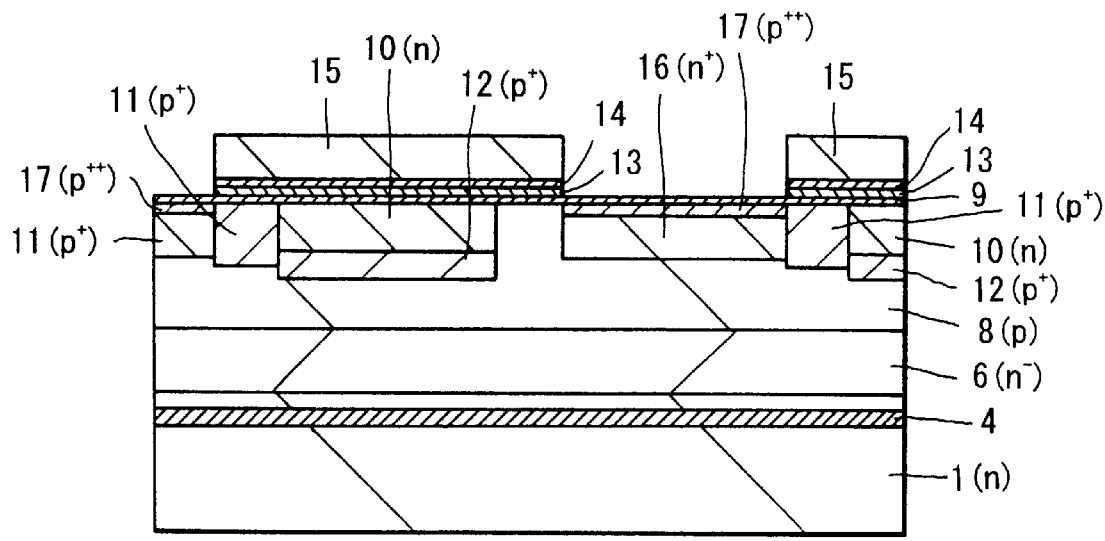
FIG. 10 is a cross-sectional view for explaining the method for manufacturing a CCD solid-state imaging device according to the second embodiment of the invention.

Next as shown in FIG. 10, a p⁺⁺-type region 17 is made by ion-implanting a p-type impurity into he surface of the n⁺-type region 16.

Figure 11:
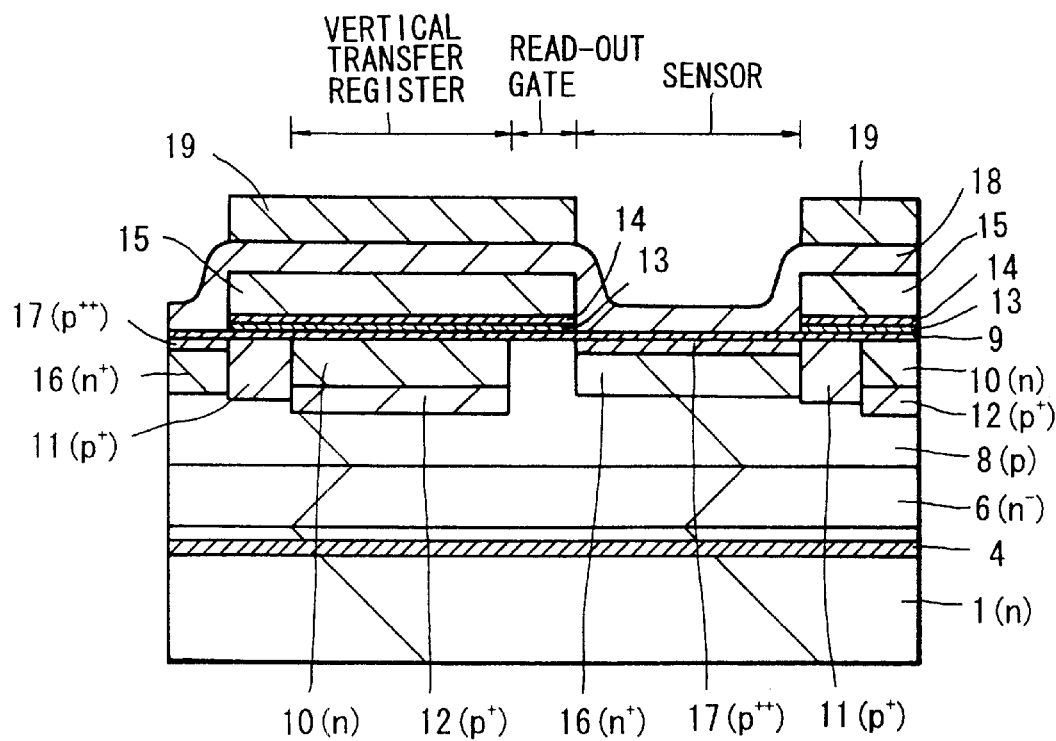
FIG. 11 is a cross-sectional view for explaining the method for manufacturing a CCD solid-state imaging device according to the second embodiment of the invention.

After that, as shown in FIG. 11, an inter-layer insulating film 18 of $SiO_2$, for example, is made on the entire substrate surface, and an Al shade film 19 is formed on the part of the inter-layer insulating film 18 above the transfer electrode 15.

The intended CCD solid-state imaging device is thus completed.

Figure 12:
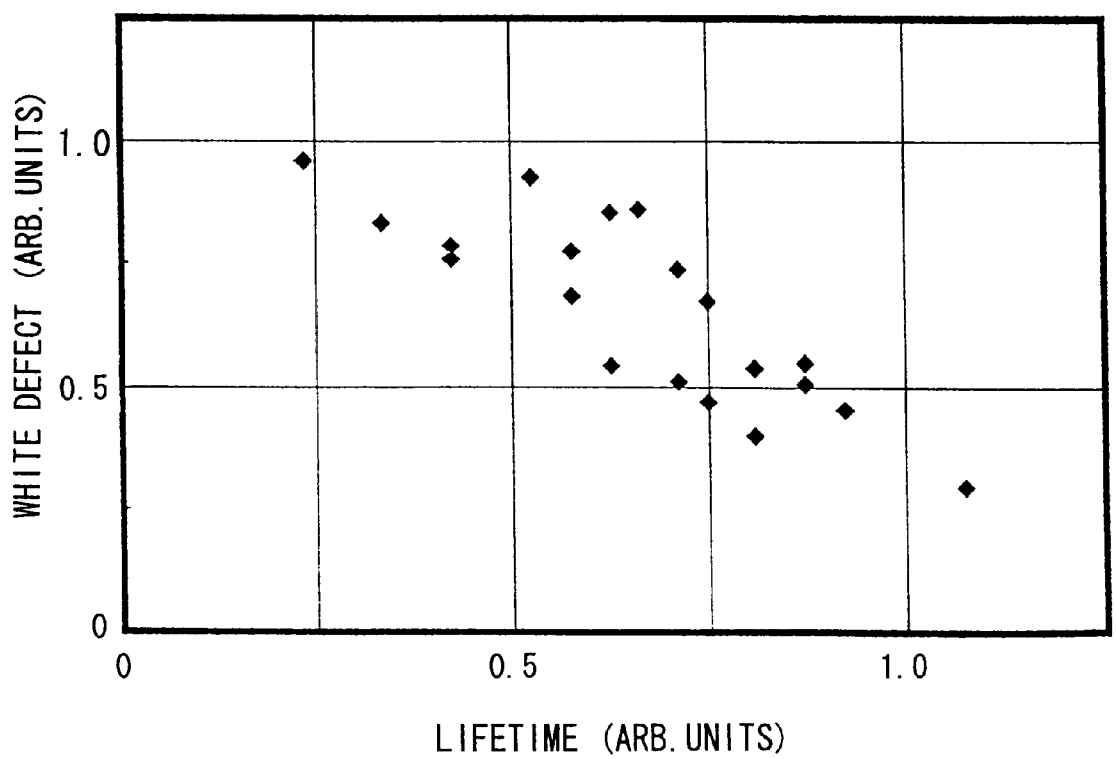
FIG. 12 is a graph showing correlation between recombination lifetime measured on a Si epitaxial substrate in a location above a carbon non-implanted region and white defects of a CCD solid-state imaging device manufactured by using the Si epitaxial substrate.

FIG. 12 shows a result of measurement on a relationship between recombination lifetime measured at a central portion of the Si epitaxial substrate 7 and white defects of the CCD solid-state imaging device manufactured by using the Si epitaxial substrate 7. As shown in FIG. 12, there is an apparent correlation between recombination lifetime and white defects, and white defects increases as the recombination lifetime decreases.

Also regarding white defects of the CCD solid-state imaging device made in a portion overlapping the carbon non-implanted region 5 in the Si epitaxial substrate 7, the result of measurement was substantially similar to the result of measurement of white defects of the CCD solid-sate imaging device formed in a portion of the carbon implanted region 4 in the Si epitaxial substrate 7. This is probably because the diffusion length of metal impurities affecting white defects is sufficiently larger than the size of the carbon non-implanted region 5 at the temperature for heat treatment in the process for manufacturing the device.

As explained above, according to the second embodiment, since the CCD solid-state imaging device is manufactured by using a previously selected good-quality Si epitaxial substrate 7 in which impurity contamination by heavy metal impurities, or the like, is remarkably reduced, a CCD solid-state imaging device remarkably reduced in white defects and excellent in property can be manufactured with a high yield. Additionally, although conventional techniques could locate only after making solid-state imaging devices, the second embodiment, configured to select only good products with a high accuracy still in the state of Si epitaxial substrates 7, can remove futility by fabrication of defective CCD solid-state-imaging devices using defective Si epitaxial substrates 7 with much impurity contamination by heavy metal impurities, for example, and hence remarkably reduce the manufacturing cost of CCD solid-state imaging devices.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, structures, configurations, processes and numerical values introduced in the first and second embodiments are but examples, and any appropriate other structures, configurations, processes and numerical values may be employed, if necessary.

Specifically as to the first embodiment, although two carbon pe-implanted regions 5 are formed in the Si epitaxial substrate 7, the number of the carbon non-implanted region 5 may be only one, or three or more. For example, as shown by the dot-and-dash lines in FIG. 6, additional three carbon non-implanted regions 5 may be made to form five carbon non-implanted regions in total.

Regarding the second embodiment, explained as making the $n^+$-type region 16 in the p-type well region 8 formed in the $n^-$-type Si epitaxial layer 6 on the n-type Si epitaxial substrate 7 such that the $n^+$-type region 16 and the p-type well region 8 form a photo diode as the photo sensor, it may be modified to form a photo diode by making an n-type region in the p-type Si epitaxial layer.

Moreover, needless to say, the invention is applicable also to fabrication of CCD solid-state imaging devices of a type having an in-layer lens.

Furthermore, although the first embodiment has been explained as evaluating acceptability of the Si epitaxial substrate 7, the result of the evaluation may be used also for contamination control of the epitaxial growth apparatus used therefor. In this manner, contamination control of the epitaxial growth apparatus can be made without using a monitor substrate.

As described above, according to the epitaxial semiconductor substrate by the present invention having formed at least one carbon non-implanted region along one major surface of the semiconductor substrate, acceptability of the epitaxial semiconductor substrate treated by carbon gettering can be evaluated precisely and quickly by measuring recombination lifetime or surface photo voltage of the epitaxial layer in the location above the carbon non-implanted region.

According to the manufacturing method of an epitaxial semiconductor substrate by the invention, configured to ion-implant carbon onto one major surface of the semiconductor substrate and make at least one carbon non-implanted region, acceptability of the epitaxial semiconductor substrate treated by carbon gettering can be evaluated precisely and quickly by measuring recombination lifetime or surface photo voltage of the epitaxial layer in the location above the carbon non-implanted region.

According to the manufacturing method of a semiconductor device by the present invention, using a good-quality epitaxial semiconductor substrate with remarkably reduced impurity contamination by heavy metal impurities, for example, semiconductor devices excellent in property can be manufactured with a high yield.

According to the manufacturing method of a solid-state imaging device by the present invention, using a good-quality epitaxial semiconductor substrate with remarkably reduced impurity contamination by heavy metal impurities, for example, solid-state imaging devices remarkably reduced in white defects and excellent in property can be manufactured with a high yield.

What is claimed is:

1. An epitaxial semiconductor substrate, which comprises:
    a first epitaxial layer in which carbon is ion-implanted along a major surface of a semiconductor substrate;
    a second epitaxial layer that forms a semiconductor, stacked on said major surface of the semiconductor substrate; and
    a carbon non-implanted region, provided at least in one portion along said major surface of said semiconductor substrate,
    wherein a relationship between said carbon non-implanted region and a part of said second epitaxial layer located above said carbon non-implanted region enables a measurement of a recombination lifetime or a surface photo voltage of said epitaxial semiconductor substrate when said measurement is taken from said part of said second epitaxial layer located above said carbon non-implanted region.

2. The epitaxial semiconductor substrate according to claim 1 wherein a minimum width of said carbon non-implanted region is not less than a thickness of said semiconductor substrate.

3. A method for manufacturing an epitaxial semiconductor substrate which comprises the steps of:
    ion implanting carbon along a major surface of a semiconductor substrate while making a carbon non-implanted region at least in one location of said major surface; and
    stacking an epitaxial layer that forms a semiconductor on said major surface of said semiconductor substrate,
    wherein a part of said epitaxial layer located above said carbon non-implanted region is used to measure a recombination lifetime or a surface photo voltage thereof.

4. The method for manufacturing an epitaxial semiconductor substrate according to claim 3 wherein a minimum width of said carbon non-implanted region is not less than a thickness of said semiconductor substrate.

5. A method for manufacturing a semiconductor device having an epitaxial semiconductor substrate, which comprises the steps of:
    ion-implanting carbon along a major surface of a semiconductor substrate while making a carbon non-implanted region at least in one location of said major surface;
    stacking an epitaxial layer that forms a semiconductor on said major surface of said semiconductor substrate; and
    measuring a recombination lifetime or a surface photo voltage of a part of said epitaxial layer located above said carbon non-implanted region, using a result thereof to evaluate acceptability of said epitaxial semiconductor substrate; and
    manufacturing the semiconductor device using said epitaxial semiconductor substrate if said measuring determines that said epitaxial semiconductor substrate is acceptable.

6. The method for manufacturing a semiconductor device according to claim 5 wherein acceptability of said epitaxial semiconductor substrate is evaluated by measuring a recombination lifetime of said carbon non-implanted region of said semiconductor substrate, measuring a recombination lifetime of a part of said epitaxial layer above said carbon non-implanted region, and evaluating whether a ratio of a measured value of said recombination lifetime of the part of said epitaxial layer above said carbon non-implanted region to a measured value of said recombination lifetime of said carbon non-implanted region of said semiconductor substrate is larger than a predetermined value.

7. The methd for manufacturing a semiconductor device according to claim 5 wherein acceptability of said epitaxial semiconductor substrate is evaluated by measuring a surface photo voltage of said carbon non-implanted region of said semiconductor substrate, measuring a surface photo voltage of a part of said epitaxial layer above said carbon non-implanted region, and evaluating whether a ratio of a measured value of said surface photo voltage of the part of said epitaxial layer above said carbon non-implanted region to a measured value of said photo voltage of said carbon non-implanted region of said semiconductor substrate is larger than a predetermined value.

8. A method for manufacturing a solid state imaging device having an epitaxial semiconductor substrate, which comprises the steps of:

ion-implanting carbon along a major surface of a semiconductor substrate while making a carbon non-implanted region at least in one location of said major surface;

stacking an epitaxial layer that forms a semiconductor on said major surface of said semiconductor substrate; and measuring a recombination lifetime or a surface photo voltage of a part of said epitaxial layer located above said carbon non-implanted region, using a result thereof to evaluate acceptability of said epitaxial semiconductor substrate; and manufacturing the solid state imaging device using said epitaxial semiconductor substrate if said measuring determines that said epitaxial semiconductor substrate is acceptable.

9. The method for manufacturing a solid-state imaging device according to claim 8 wherein a minimum width of said carbon non-implanted region is not less than a thickness of said semiconductor substrate.

10. The method for manufacturing a solid-state imaging device according to claim 8 wherein acceptability of said epitaxial semiconductor substrate is evaluated by measuring a recombination lifetime of said carbon non-implanted region of said semiconductor substrate, measuring a recombination lifetime of a part of said epitaxial layer above said carbon non-implanted region, and evaluating whether a ratio of a measured value of said recombination lifetime of the part of said epitaxial layer above said carbon non-implanted region to a measured value of said recombination lifetime of said carbon non-implanted substrate is larger than a predetermined value.

11. The method for manufacturing a solid-state imaging device according to claim 8 wherein acceptability of said epitaxial semiconductor substrate is evaluated by measuring a surface photo voltage of said carbon non-implanted region of said semiconductor substrate, measuring a surface photo voltage of a part of said epitaxial layer above said carbon non-implanted region, and evaluating whether a ratio of a measured value of said surface photo voltage of the part of said epitaxial layer above said carbon non-implanted region to a measured value of said semiconductor substrate is larger than a predetermined value.

12. An epitaxial semiconductor substrate according to claim 1, wherein said epitaxial semiconductor substrate further comprises a flatly oriented region, and said carbon non-implanted region comprises side edges that are parallel to directions parallel and normal to the flatly oriented region.

13. An epitaxial semiconductor substrate according to claim 1, wherein said carbon non-implanted region is square in a cross sectional shape.

14. An epitaxial semiconductor substrate according to claim 1, wherein said carbon is ion-implanted to have a peak concentration at a position deeper than said major surface.

15. An epitaxial semiconductor substrate according to claim 1, wherein said carbon non-implanted region is laterally surrounded by carbon-implanted regions of said semiconductor substrate.

* * * * *